US006411015B1

(12) United States Patent
Toda

(10) Patent No.: US 6,411,015 B1
(45) Date of Patent: Jun. 25, 2002

(54) MULTIPLE PIEZOELECTRIC TRANSDUCER ARRAY

(75) Inventor: Minoru Toda, Lawrenceville, NJ (US)

(73) Assignee: Measurement Specialties, Inc.

( * ) Notice: Subject to any disclaimer, the term of this patent is extended or adjusted under 35 U.S.C. 154(b) by 0 days.

(21) Appl. No.: 09/567,385

(22) Filed: May 9, 2000

(51) Int. Cl.[7] .......... H01L 41/08

(52) U.S. Cl. .......... 310/334; 310/330; 310/366; 310/800

(58) Field of Search .......... 310/800, 334, 310/367, 369, 330

(56) References Cited

U.S. PATENT DOCUMENTS 3,816,774 A * 6/1974 Ohnuki .......... 310/800 X
4,028,566 A * 6/1977 Franssan et al. .......... 310/330 X
4,056,742 A * 11/1977 Tibbetts .......... 310/800 X
4,127,749 A * 11/1978 Atoji et al. .......... 310/800 X
4,284,921 A * 8/1981 Lemonon .......... 310/800 X

* cited by examiner

*Primary Examiner*—Mark O. Budd
(74) *Attorney, Agent, or Firm*—Duane Morris LLP

(57) ABSTRACT

A multiple transducer array structure comprises a single piezoelectric film material having a plurality of alternately shaped concave and convex regions and responsive to an energy signal incident thereon, the alternating concave and convex regions each having a given radius, each of the regions integrally formed with another of the regions, each of the concave and convex regions vibrating in response to the energy signal with opposite phase to cause the transducer to operate at a given resonant frequency determined by the average radius of the regions. A method of forming the corrugated transducer is also disclosed.

19 Claims, 13 Drawing Sheets

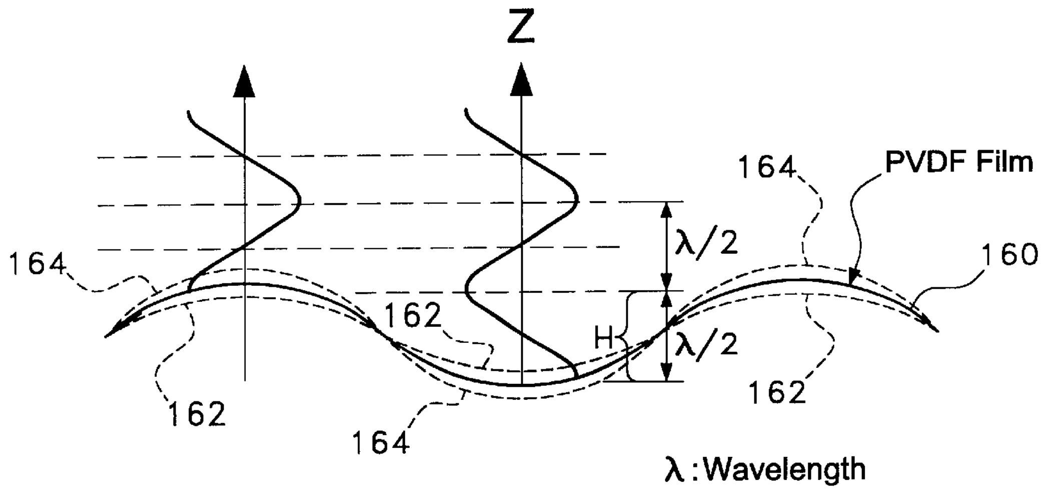
Fig. 5
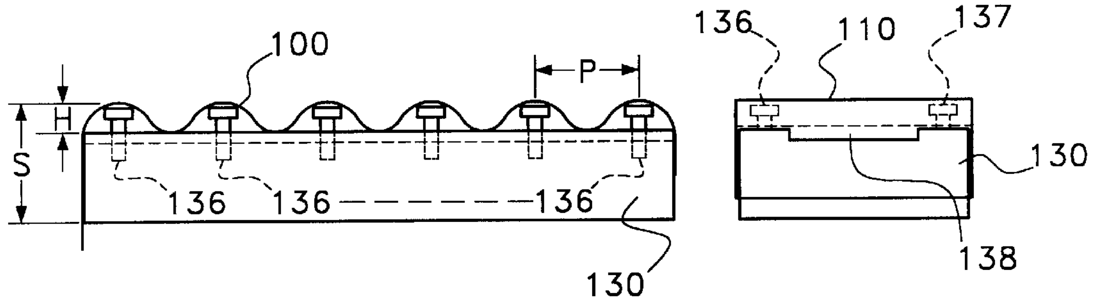
Fig. 6A
Fig. 6B

MULTIPLE PIEZOELECTRIC TRANSDUCER ARRAY

FIELD OF THE INVENTION

The present invention relates to the field of transducers, and more particularly to piezoelectric ultrasonic airborne transducers.

BACKGROUND OF THE INVENTION

Conventional ultrasonic transducers in air use a structure wherein a curved film of piezoelectric material is clamped at both ends and the film is allowed to vibrate. FIGS. 1 and 2 depict prior art ultrasonic devices useful in a variety of modes (e.g. pulse-echo mode) and in numerous applications such as robotics, vehicle safety and control systems, object recognition systems and other remote distance measurement devices, for example. FIG. 1 depicts a single element transducer comprising a PVDF film 10 supported by a housing 20 and having edges 10*a* and 10*b* of the film secured or clamped via clamp portion 22 of the housing. The film spans the housing in the stretched direction (x-direction). The resonance frequency is given as $f_o=(\frac{1}{2}\Pi R)\times(Y/\rho)^{1/2}$ where Y=Young'smodulus of the PVDF material and ρ=density of the PVDF.

In this case the radius R of the film determines the resonance frequency and the maximum area is (ΠR)×(length) which means that one cannot choose the radius and area arbitrarily. Thus, if one wants to design a very large area transducer to increase the output or to decrease the beam angle, a multiple element transducer structure must be used.

The multiple transducer structure shown in Prior art FIG. 2 depicts a series of such PVDF film elements 10, 11, . . . 14 which are clamped at their respective ends (10*a*, 10*b*, 11*a*, 11*b*, . . . 14*a*, 14*b*) via clamp sections 22 each having a narrow channel or slot within housing 20 for receiving and securing the edges of the film material. A significant drawback associated with conventional clamped transducers, however, is that the housing and holding structure 20 of these transducers requires a stiff material and a non-resonant, heavy structure. Particularly, the clamp of the film requires a large mass and stiffness and a large clamping force to achieve a uniform clamp. These requirements severely constrain the transducer and make mass production of such devices extremely difficult. Moreover, if one wishes to make multiple transducers operated by a common drive source (effectively, a large area transducer), the resonance frequency of all the elements must be essentially equal. The resonance frequency, while mainly determined by the curvature R, is also influenced by the clamping structure. Therefore, the radius and the clamp structure must be uniform for all of the elements. The above situation requires devices to be made in singular fashion (i.e. one by one) and then combined to make an array only after testing and eliminating sub-standard devices. The present structure and process thus makes mass production of these transducer arrays virtually impossible.

Accordingly, a transducer structure that eliminates the aforementioned clamping of each of the elements and does not require uniform radius of each of the elements, while providing a strong signal at a resonant frequency and having phase compensation, narrow beam pattern, and controllable beam directivity, is highly desired.

SUMMARY OF THE INVENTION

The present invention obviates the aforementioned problems by providing a multiple curved section transducer using a single large film and capable of mass production. The multiple transducer array comprises a piezoelectric film having a plurality of alternating concave and convex regions integrally formed and responsive to an energy signal incident thereon to cause each of the concave and convex regions to vibrate with opposite phase to cause the transducer to operate at a given frequency. The requirement of having clamped sections throughout the transducer structure is virtually eliminated, as well as the requirement of uniform radius, because each section is integrally coupled to another section so that instead of each section having its own resonance, one common resonance from all of the sections or elements exists. In this fashion, the performance is the same as that of a conventional array of curved film transducers.

While the conventional approach has been to align all elements in the same direction, the present invention utilizes a structure wherein the curvature direction is a series of alternating sequential concave-convex pairs. In the prior art transducer structures a high frequency voltage applied to the PVDF film causes the film length to expand or shrink and the central region of the film to move back and forth normal to the surface due to the clamps. In the present invention, the film length expands or shrinks in the same way and the central region moves back and forth normal to the surface, however the vibration phase is opposite for the concave and convex regions. Since the moving regions are opposite to one another, a neutral line exists between a pair of one region and another region which remains stationary (i.e. does not move). Therefore, the neutral line may be clamped and would not influence vibration.

It is an object of the present invention to provide a corrugated transducer apparatus comprising a piezoelectric film comprising a plurality of corrugations defined by alternating peaks and valleys of a periodic nature in a given dimension. The alternating peaks and valleys differ in height by an odd integer number of half wavelength to cause vibration signals from the alternating peaks and valleys in response to an energy signal incident thereon to be in phase, thereby constructively adding to one another to generate an amplified output signal.

BRIEF DESCRIPTION OF THE DRAWINGS

FIG. 5 is a schematic illustration of the vibration characteristics of the PVDF film according to the present invention.

FIGS. 6A and 6B are different views of the transducer array according to the present invention.

DETAILED DESCRIPTION OF THE INVENTION

Figure 3:
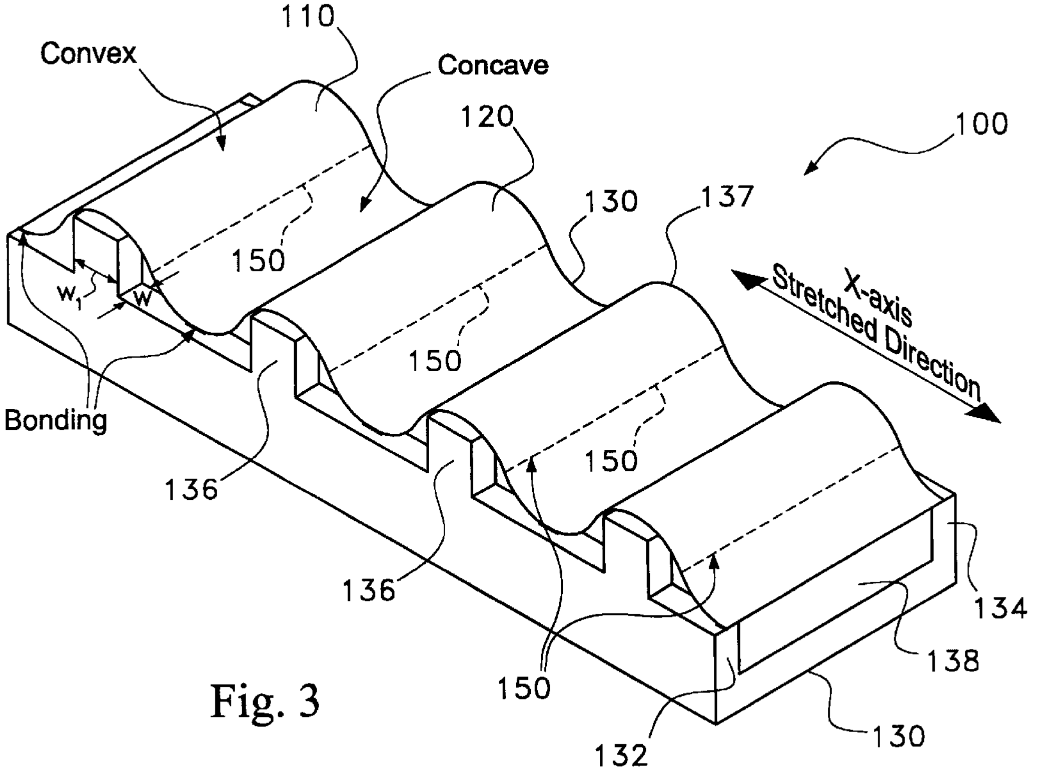
FIG. 3 illustrates a piezoelectric multiple transducer array structure according to the present invention.
Figure 4A:
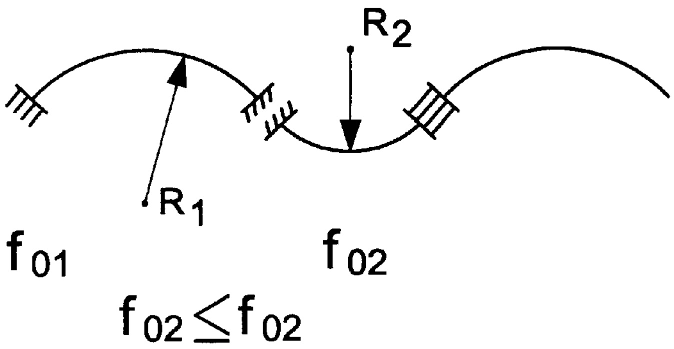
FIG. 4A is a schematic illustration of a prior art clamped device having different radii.
Figure 4B:
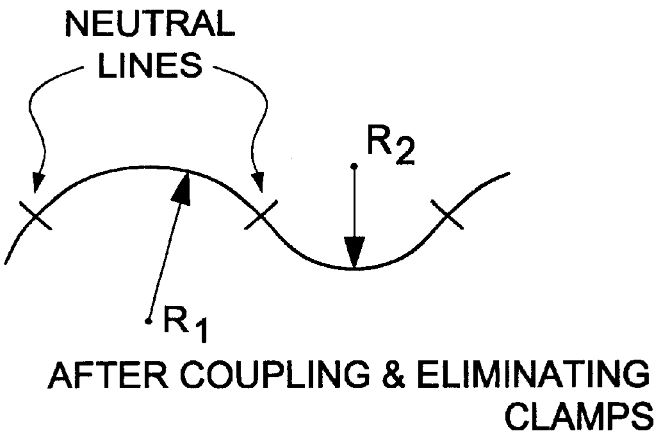
FIG. 4B is a schematic illustration of the neutral lines associated with the transducer array according to the present invention.
Figure 7:
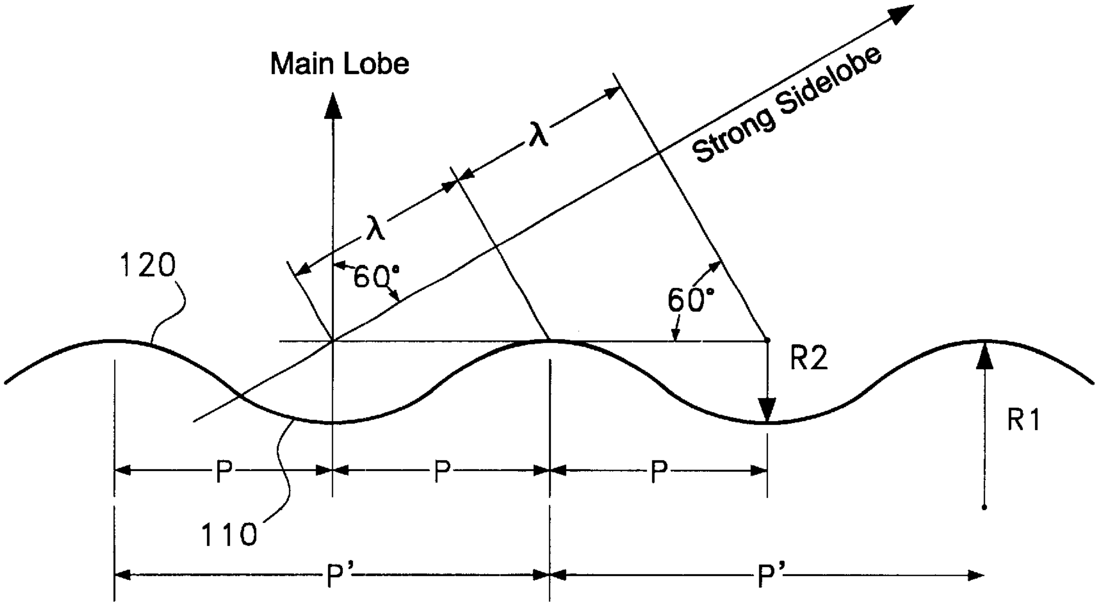
FIG. 7 is a schematic illustration depicting the directivity of the transducer array according to the present invention.

Referring now to FIG. 3, there is shown an embodiment of a piezoelectric multiple transducer array structure 100 according to the present invention. The array 100 comprises a piezoelectric film 110 which in the preferred embodiment is a thin film of PVDF. The PVDF is oriented with the x-axis along the stretched direction of the material. The film 110 comprises a plurality of corrugations defined by alternating peaks 120 and valleys 130 which are separated by a distance P (see FIG. 7). The corrugations are periodic with period P'. Each of these concave and convex regions have an associated radius R1 (concave region) or R2 (convex region) as shown in FIG. 4B. The radii for each section may vary by as much as 100%, however, the radii for all of the convex and concave sections are averaged to determine one common resonance associated with the transducer structure, thereby forming a very broad band resonance. The tolerance of accuracy of the geometry is much lower than in the prior art which employed multiple separated devices having a clamp for each device. This is because each section does not resonate independently, but rather all sections are strongly coupled.

As shown in FIG. 3, housing or holder 130 is disposed beneath the corrugated PVDF film and comprises a substrate having substantially planar opposite sides 132, 134 extending along the stretched direction of the film. The housing is preferably made of a plastic or metal. A series of protrusions 136, 137 extend upward from opposite sides 132, 134, respectively and in parallel alignment with one another as shown in FIG. 3. Each of the protrusions 136 (and 137) are spaced apart are predetermined distance from one another in periodic fashion with the same period as that of the film. The protrusions are disposed transverse to the stretched direction of the film and may extend to each of the opposite sides for supporting the film at each of the concave regions. Alternatively, the protrusions may be formed only along each of the opposite sides 132, 134 as illustrated in FIGS. 6A and 6B. The protrusions may be integrally formed within the substrate or may be inserted like posts (e.g. screws) a predetermined distance into the surface of the substrate, as best shown in FIG. 6A. The protrusions each have a width w1 and height h1 sufficient to support the film without causing deformation. Cavity portion 138 is formed between each of the sides 132, 134. The sides have a width w sized sufficiently to allow the convex regions of the film to be secured thereto. The film may be secured to the substrate by a variety of methods well known in the art, including application of an adhesive such as tape, epoxy, heating, or ultrasonic bonding, for example. Other well-known applications and methods for securing the film to the substrate are also contemplated.

Figure 1:
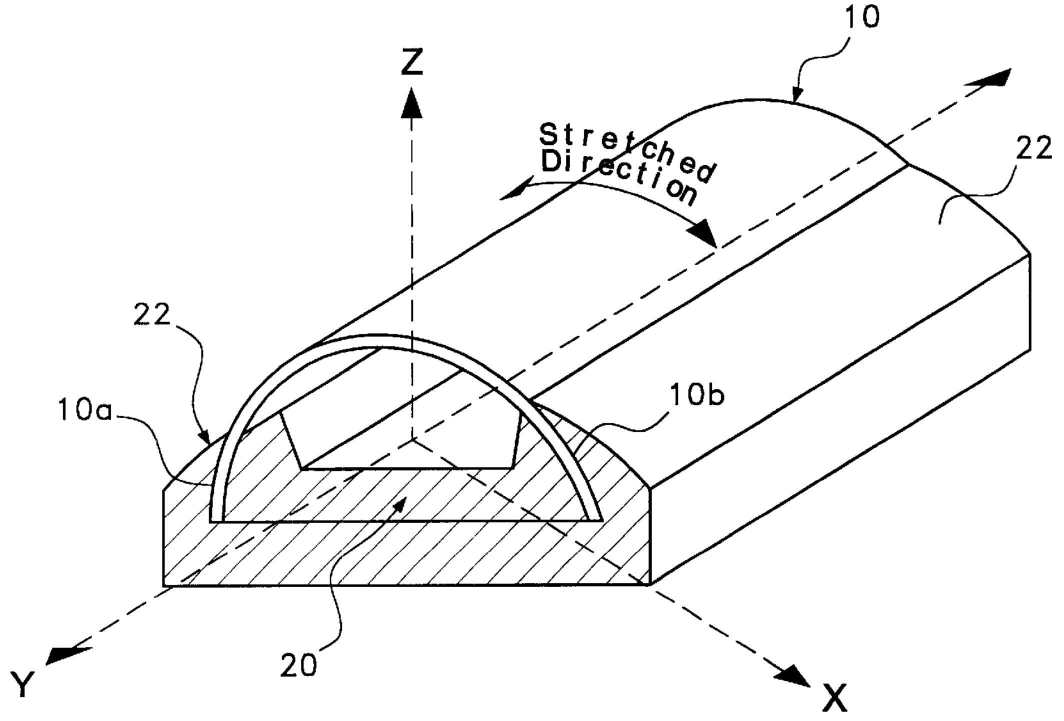
Fig. 1 (Prior Art)
FIG. 1 depicts a conventional clamped single element transducer.
Figure 2:
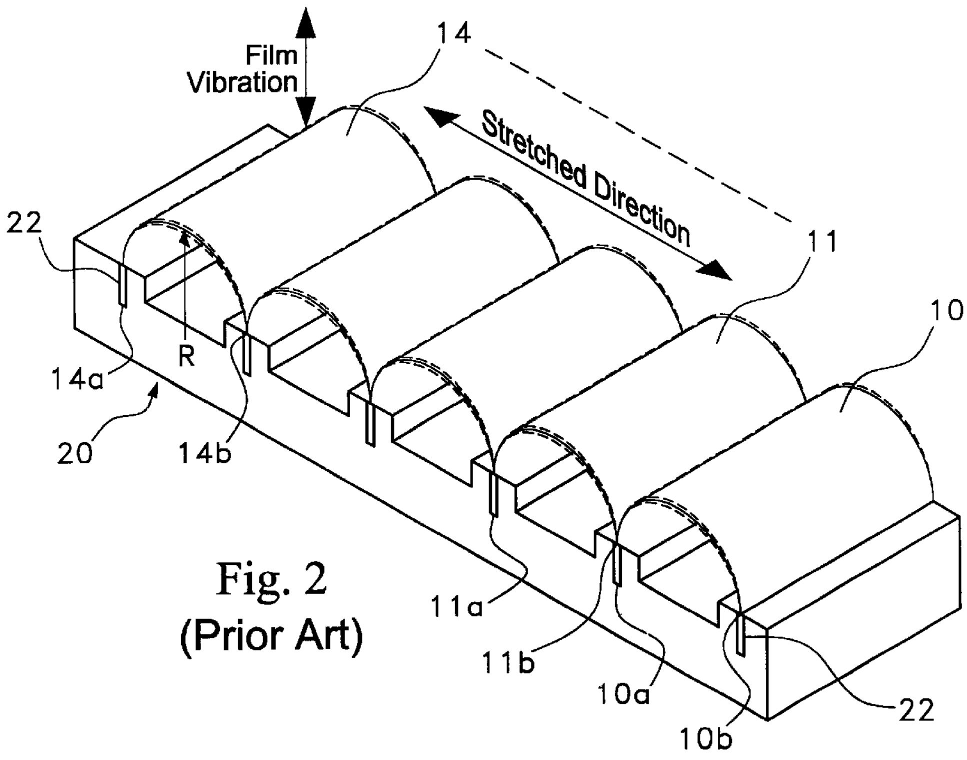
Fig. 2 (Prior Art)
FIG. 2 depicts a conventional clamped multiple element transducer array.
Figure 4C:
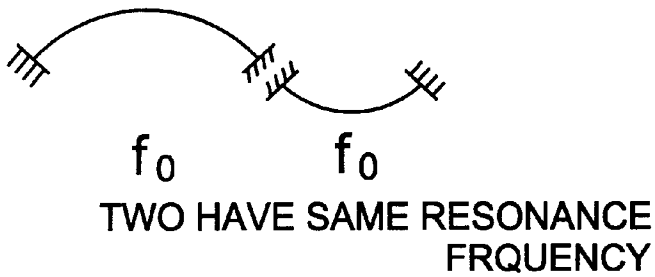
FIG. 4C is a schematic illustration of concave and convex regions having the same resonance frequency.

Referring now to FIG. 3 in conjunction with FIG. 5, when a source of energy is incident onto the PVDF film, each of the concave and convex regions are resonated at a frequency and are caused to vibrate. The vibration phase is opposite for the concave and convex regions and the film undergoes a series of contractions 162 and elongations 164 relative to the position of the film in steady state 160 (see FIG. 5). This means that the phase of radiated acoustic wave from one section is opposite from that of another section and cancels at a far location. When the height H from the top (i.e. peak) of the convex region to the bottom (i.e. valley) of the concave region is chosen to be half of a wavelength, the radiated ultrasound radiates in opposite phase and is constructively added to produce an amplified acoustic beam. That is, the height H functions as a phase compensator and the acoustic beams propagating normal to the transducer axis have the same phase and are constructively added to produce a stronger output beam signal. Note that, as shown in FIG. 3, neutral or stationary regions 150 are developed on the film at positions intermediate each of the adjacent concave and convex regions as a result of the direction of movement being opposite one another for each region. In this manner, a neutral or stationary line between one region and another region is operative such that clamping if desired, at stationary position 150, does not influence the vibration of the film. In the prior art clamped transducer structures, the resonance frequency was determined by the radius of the separated devices (see FIGS. 1, 2 and particularly 4A). In this case, if the radius is different from one section to another, the resonance frequency is different for each. In the present invention, every device is coupled so that the neutral line is automatically chosen so as to obtain the same resonance frequency for both regions, as shown in FIG. 4B. This situation is understandable from the diagram of FIG. 4C where one may have a smaller radius, however, its averaged radius is larger, and the resonance frequency becomes lower. Because the averaged radius for all sections determines one common resonance, the tolerance accuracy of the geometry is much lower than that of the prior art multiple separated devices having a clamp for each device. However, the response bandwidth becomes broader due to the nature of coupled multiple sections of different resonators.

Figure 9:
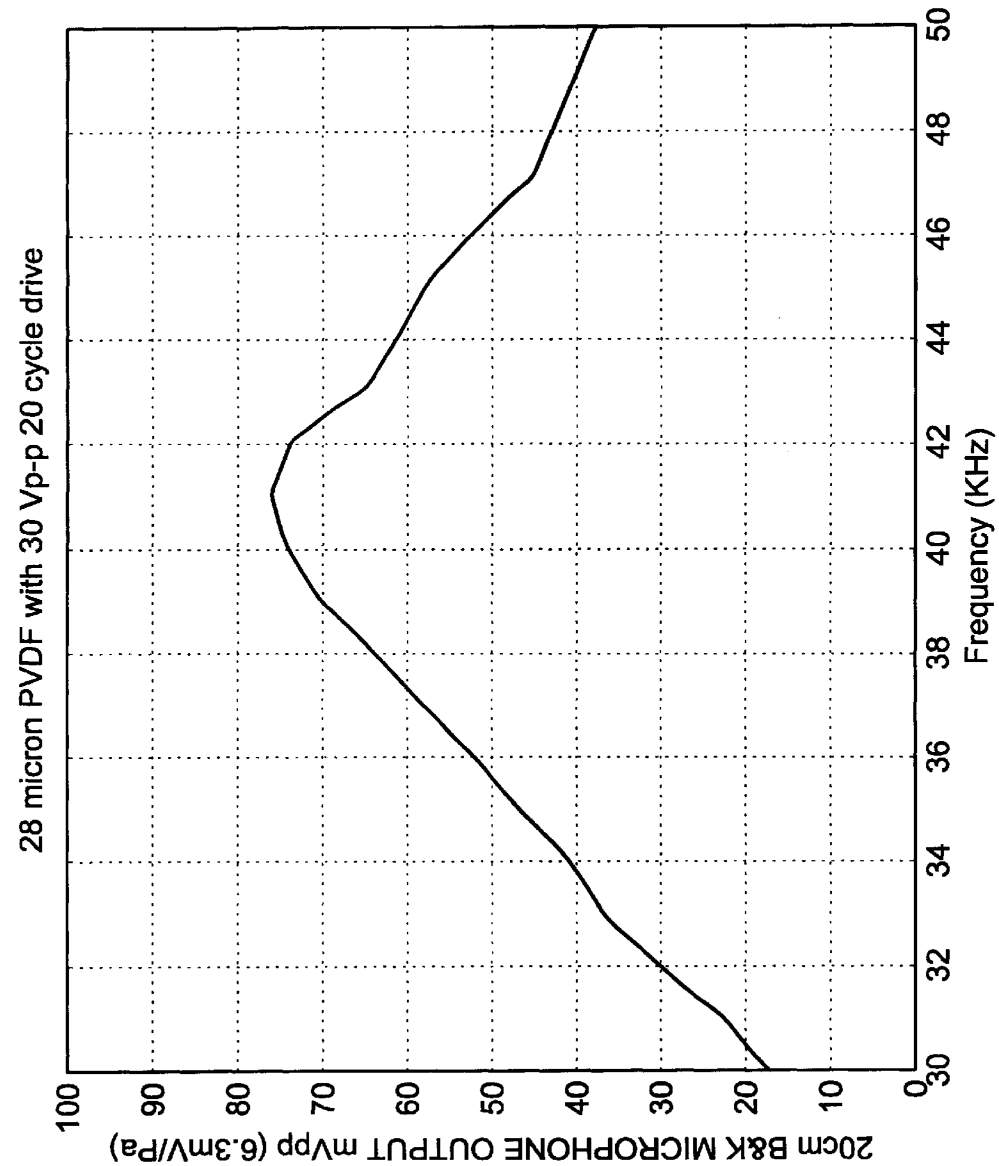
FIG. 9 shows the frequency response measured by a microphone at a right angle at 20 cm from a multiple transducer array.
Figure 10:
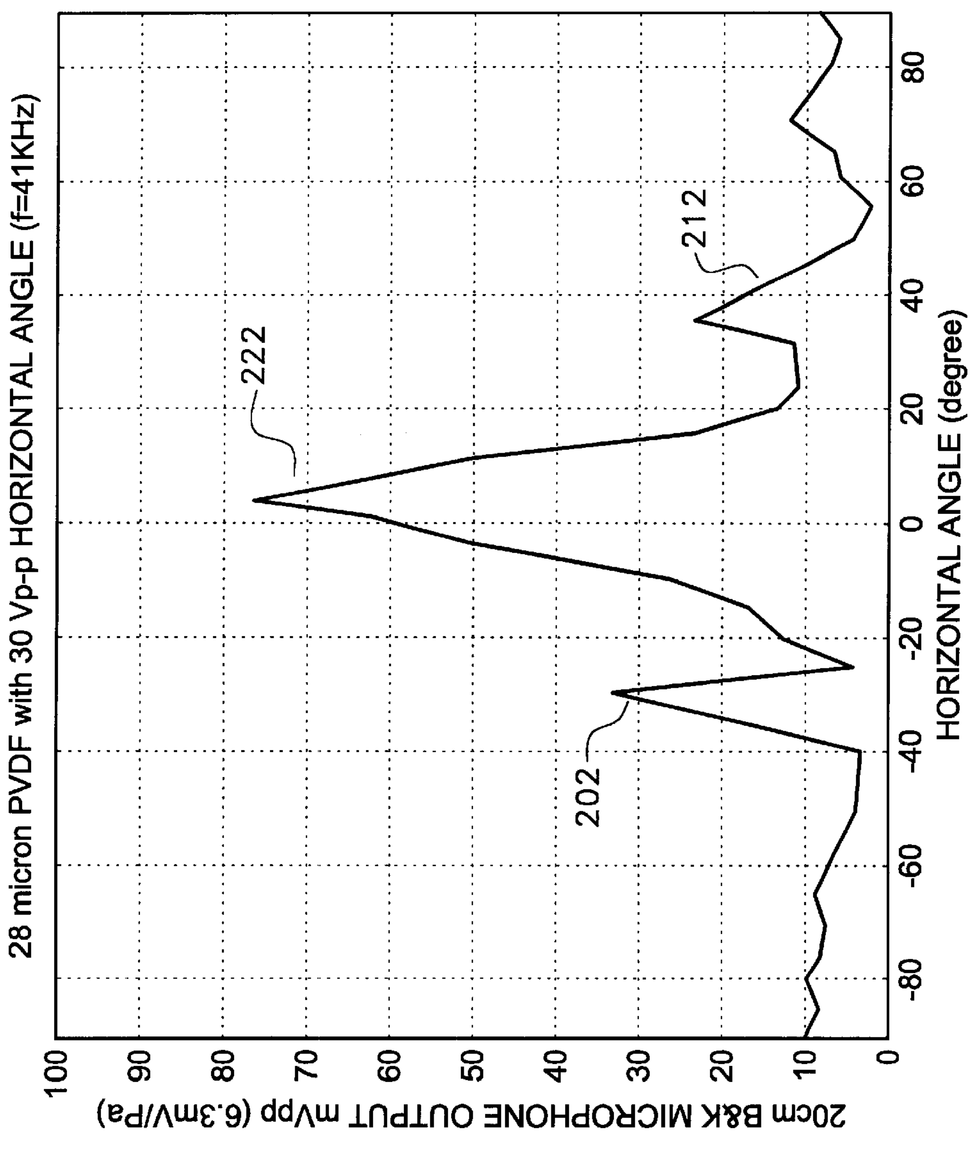
FIG. 10 depicts a horizontal angle performance from a multiple transducer array.
Figure 11:
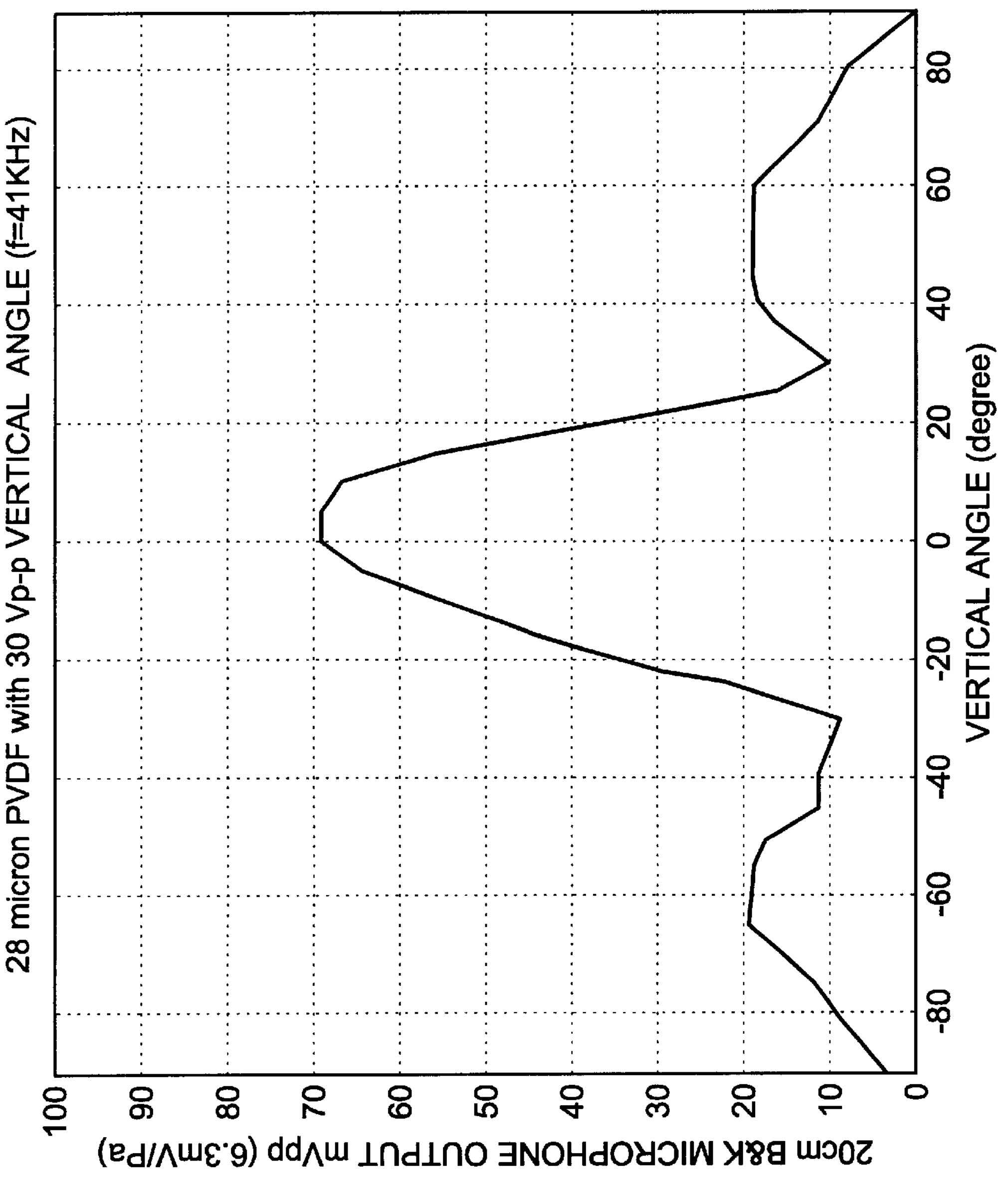
FIG. 11 depicts a vertical angle performance from a multiple transducer array.

FIGS. 6A and 6B depict an exemplary transducer array device 100 where the corrugations have a height H=0.18" (inches) or 4.57 mm (millimeters) and an overall height S=0.545 inches. FIG. 9 shows the frequency response measured by a microphone at a right angle at 20 cm from the transducer. The measurement was developed using a drive voltage of 30 Volts pp (peak-peak). However, other drive voltages are of course contemplated, such as application of 200 Vp-p for 28 $\mu$m (micron) thick PVDF film with a proportional increase in output pressure. FIG. 10 depicts a horizontal angle performance, which is the variation of the output when the device is rotated in the horizontal plane with a central ridge of the corrugation as rotational axis. Two weak sidelobes are present at 30 and 35 degrees. FIG. 11 shows vertical angle performance, which is the variation of the output when the device is rotated in the vertical plane. Two sidelobes are present at 60 and 50 degrees. Note that corrugated transducers having ranges of between 35 KHz–250 KHz have been made, and it is possible to extend this region to a further wider frequency range as necessary.

Figure 12:
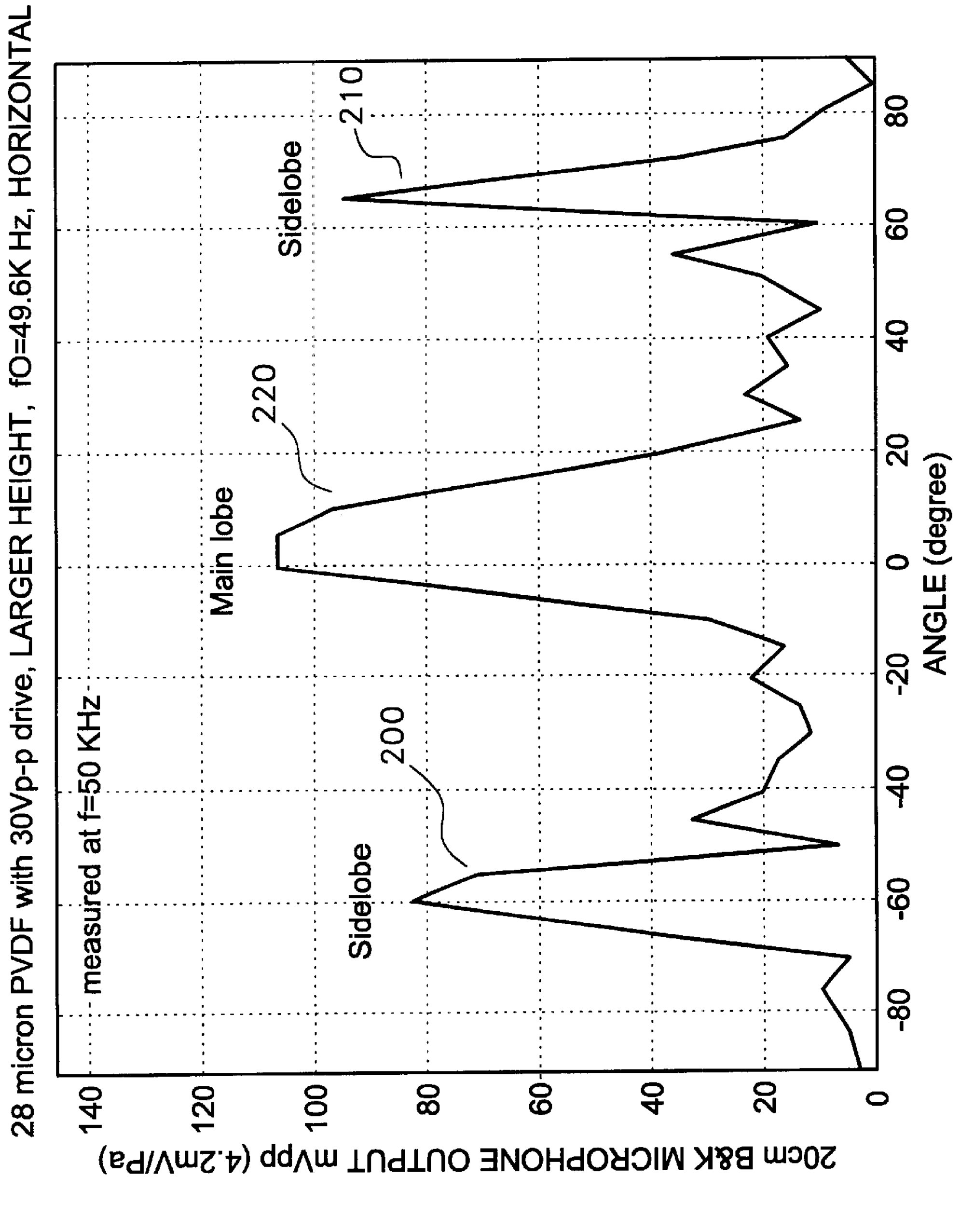
FIG. 12 depicts the performance of a 50 KHz transducer array.

Typically, a periodic structure generates strong side lobes (i.e. side lobes having substantially the same amplitude as the main lobe) if the periodicity and the wavelength are in certain relation to one another. For example, use of the same housing or holder 130 as shown in FIG. 6A but increasing the height of the protrusions 136, 137 results in a larger height difference from top to bottom and a smaller radius created a resonance at 50 KHz (kilohertz), side lobes 200, 210 at 60 and 65 degrees having a peak height of almost the same as the main lobe 220 as shown in FIG. 12.

According to diffraction grating theory, the relation between periodicity P (horizontal distance between high and low points having the same intensity and phase) and wavelength and angle is given as:

$$P \sin \theta = \lambda \text{ where } \lambda = Vs/f \text{ and } Vs = 344 \text{ meter/sec}$$

$$\theta = \arcsin(\lambda/P)$$

Referring again to FIG. 7, P is the main period of the signal and P' is the apparent period of the corrugation structure. Note that P' is the period of the structure but the ultrasonic signal has the same periodicity as P'. For the conditions depicted in FIG. 12, p=8 mm, λ=6.88 mm (50 KHz), θ=60 degrees satisfies the above equation. Thus 50 KHz operation is not appropriate for p=8 mm due to the strong side lobe. However, when the transducer is operated at a frequency of 40 KHz as shown in FIG. 10, λ=8.6 mm and P=8 mm and does not generate the strong side lobe because θ=arcsin(λ/P) does not exist. As shown in FIG. 10, smaller side lobes 202, 212 are present at 30 and 35 degrees. This is caused by the larger period from top to top (or bottom to bottom) which is P'=16 mm, which is a weaker period (if the top point and bottom point generate exactly the same strength of signal after λ/2 phase compensation, the larger period would not exist, but some imbalance made this periodicity). The parameters of P'=16 mm, λ=8.6 mm and θ=32.5 degrees satisfies the relation of P'sin θ=λ, which is consistent with the observation. The design requirement is then given by [0.5×P' (top to top distance)] <wavelength (λ), which condition does not generate a strong side lobe.

Figure 8A:
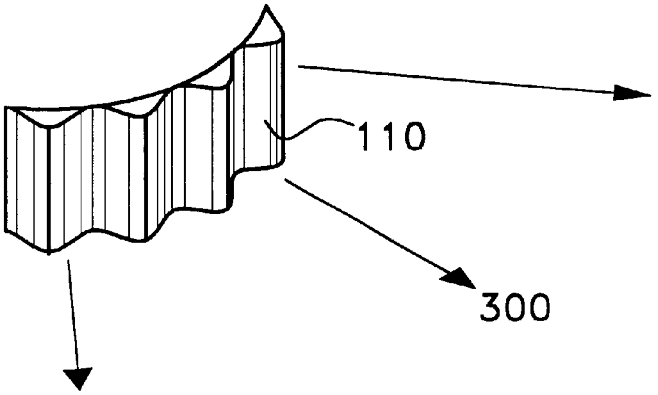
FIGS. 8A, 8B, and 8C represent schematic views of the transducer array structure formed in an arcuate shape according to the present invention.
Figure 8B:
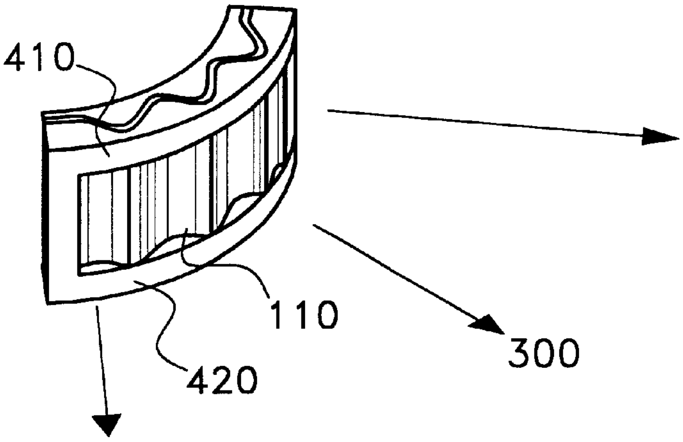
Figure 8C:
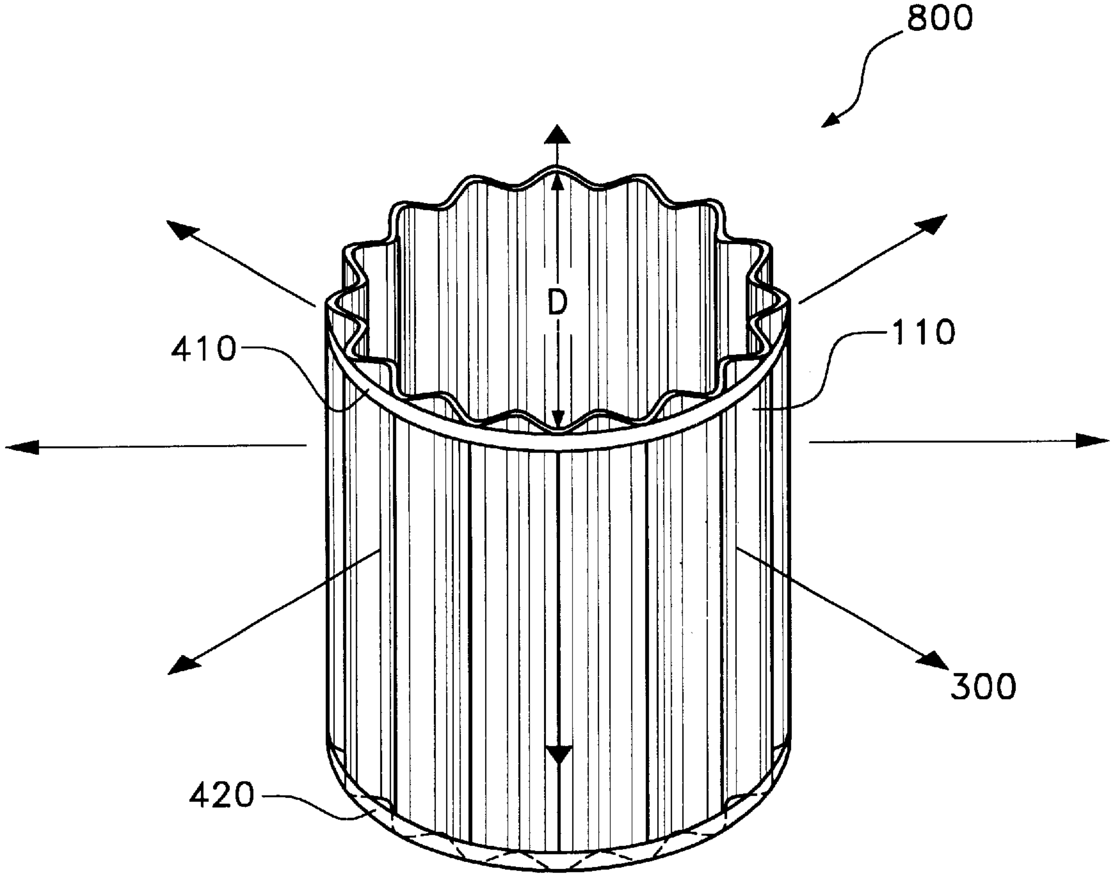

In addition to a substantially flat or planar corrugated transducer array structure as described above, the corrugated structure may also be adapted to a curved configuration. Referring now to FIGS. 8A and 8B, there is shown the concave-convex transducer array structure formed into an arcuate surface configuration in order to generate a directional ultrasound beam. For generating an omnidirectional beam 300, the arcuate surface is in the form of a cylinder. Such an omnidirectional transducer structure is depicted in FIG. 8C. The transducer 800 comprises PVDF film material 110 formed into a cylindrical, corrugated shape having a diameter D. The multiple curved shape is held by wave shaped conjugate pair of holders 410, 420 disposed at the top and bottom portions of the film material 110. In this configuration, vibration of the corrugated transducer causes operation at a resonant frequency that is independent of the diameter D (or radius D/2) of the cylinder. A disadvantage of conventional omnidirectional ultrasound transducers is that the resonance frequency of conventional transducers is limited by the radius/diameter of the film cylinder. In contrast, the resonance frequency of the corrugated cylindrical transducer is advantageously independent of the cylinder radius/diameter and is determined by the peaks and valleys of the corrugations. The clamp of the top and bottom regions do not impose severe mechanical restraints on the transducer apparatus, but function only to maintain the wavy shape of the PVDF film at the top and bottom. It is understood that the shape of the main transducer region follows the shape of the top and bottom region. In the preferred embodiment, the holders comprise thin metal strips for securing and maintaining the corrugated shape of the transducer.

Figure 13:
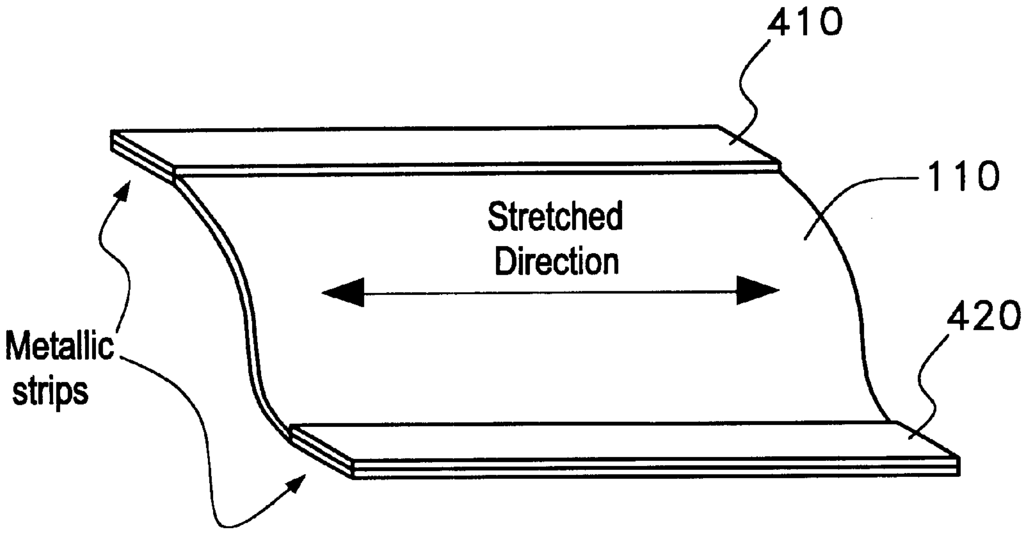
FIGS. 13 and 14 depict the steps involved in forming the corrugations onto the PVDF film.

As shown in FIG. 13, in a preferred embodiment, the method of forming the corrugations onto the PVDF film is accomplished by bonding two thin flat metal strips 410 and 420 at the long sides of the film. Electrodes are attached in known manner onto the PVDF film surfaces. The electrode material is preferably silver ink or silver-carbon ink. The electrodes are not applied to the peripheral regions so as not to short circuit the two opposing surfaces of the film. The two metallic strips are then bonded to the surface of the electrode and the bared PVDF. Bonding material may be for example, epoxy or cyano-acrylic. The metal strips serve as lead wire attaching tab and additionally operate to form the corrugation and keep the shape of the transducer permanently. Other methods of forming the courrugated structure are also contemplated including, for example, compressing the PVDF film between two waves or surfaces made on four sides of two frames to form the corrugations. The frame material may be a metal or plastic having appropriate structural and environmental characteristics.

Figure 14:
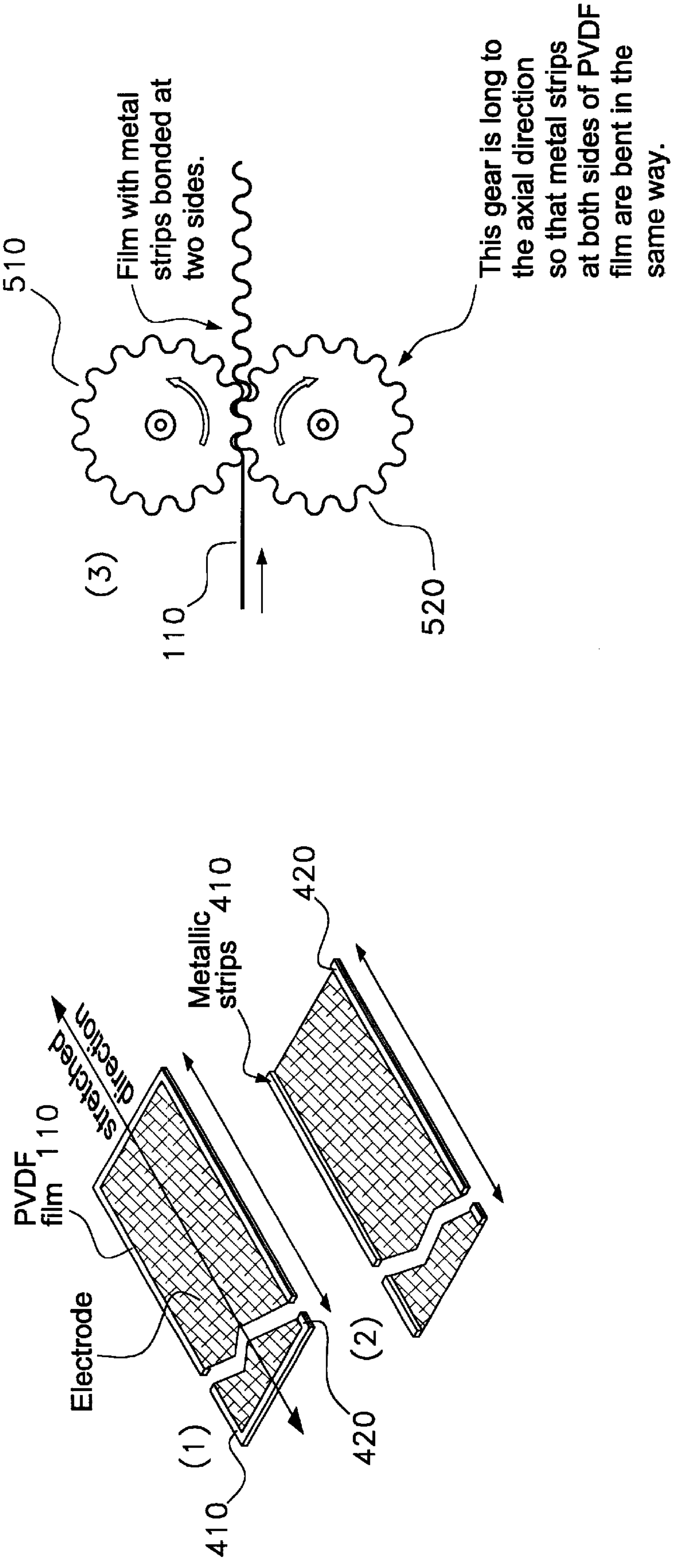

Referring now to FIG. 14, the PVDF film 110 with metal strips 410, 420 at both sides is then passed through a corrugating apparatus comprising two engaged gears 510, 520 where the metal strips are alternately bent in the same shape and the PVDF film is kept in the same shape so as to form the corrugated wave shape. The corrugated PVDF can stand alone or may be used with a housing or holder. When PVDF material is excited by a voltage, ultrasound signals are generated from the front and back surfaces. Typically suppression of the backward wave is desired. If the backward wave is reflected at a back side wall and propagates to the front side, it interferes with the main wave. To this end, a housing structure comprising a thin plate may be used to suppress the back wave. The material may be a soft, thin, absorptive material such as metal, plastic, or wood when the frequency is high (i.e. greater than 20 KHz). For a low frequency (i.e. well under 20 KHz) the plate should be made of a thick, heavy absorptive material. The corrugated film should then be loosely affixed to the plate via the metal strips so as to allow thermal expansion of the PVDF along the ridge of the corrugation (perpendicular to the molecular chain) and to avoid any film shape collapse due to expansion buckling at temperatures over 45 degrees C. which may arise if the strips are tightly affixed to a hard plate.

Note that even when the reflection from the back wall of a housing does not directly mix with the front wave, the reflected wave can propagate back to the PVDF film and modify the frequency response of the transducer. To suppress this effect, back material inside of the housing may be absorptive material, such as polyurethane form, or cloth. Another way to suppress this effect is to use a stiff back wall in the housing having a certain angle so that the reflected signals from different sections have different phases to cancel the reflection effect.

While the foregoing invention has been described with reference to the above embodiments, various modifications and changes can be made without departing from the spirit of the invention. Accordingly, all such modifications and changes are considered to be within the scope of the appended claims.

What is claimed is:

1. A transducer comprising:

a piezoelectric film comprising a plurality of alternating concave and convex regions;

first and second electrodes disposed respectively on a top surface and a bottom surface of said piezoelectric film;

said piezoelectric film responsive to a first signal incident thereon to cause each of said concave and convex regions to vibrate with opposite phase to cause said transducer to operate at a given frequency, wherein said alternating concave and convex regions have different radii.

2. The transducer array of claim 1, wherein said given frequency is a resonant frequency.

3. The transducer array of claim 1, wherein a stationary position is defined between each said concave and convex region due to cancellation of opposite motion associated with said respective concave and convex regions.

4. The transducer of claim 1, further comprising a substrate disposed beneath said piezoelectric film, said substrate having a plurality of projections in alignment with at least some of said concave regions for supporting said film.

5. The transducer of claim 1, wherein said alternating concave and convex regions are integrally formed.

6. The transducer of claim 1, wherein said film is bonded to a substrate at least some of said convex regions.

7. The transducer of claim 1, wherein said piezoelectric material is PVDF.

8. The transducer of claim 1, wherein the distance between said alternating concave and convex regions is periodic in at least one dimension.

9. The transducer of claim 1, wherein the distance in height between each said alternating concave and convex region is approximately one half wavelength of the acoustic wave output from the transducer.

10. A transducer comprising:

a single piezoelectric film material having a top surface on which is disposed a first electrode, and a bottom surface on which is disposed a second electrode, said piezoelectric film material having a plurality of alternately shaped concave and convex regions, said alternating concave and convex regions each having a given radius, each of said regions integrally formed with another of said regions, each of said concave and convex regions vibrating with opposite phase in response to a first signal incident thereon to cause said transducer to generate an output signal at a given resonant frequency in accordance with the radii of said concave and convex regions, wherein each said concave and convex region differs in height by approximately one half of the wavelength of the output signal.

11. The transducer array of claim 10, wherein sad piezoelectric material comprises PVDF.

12. The transducer of claim 10, wherein the piezoelectric material is curved into an arcuate surface to control output signal direction.

13. The transducer of claim 12, wherein the arcuate surface is cylindrical.

14. The transducer according to claim 10, further comprising a substrate having a first planar portion on which a first part of said film material is disposed, a second planar portion opposite said first planar portion on which a second part of said film material is disposed, and a cavity portion intermediate said first and second planar portions and spanned by said film material.

15. A corrugated transducer apparatus comprising:

a piezoelectric film comprising a plurality of corrugations defined by alternating peaks and valleys of a periodic nature in a given dimension, a substrate;

said film secured only at a first end to a first portion of said substrate, and at a second end to a second portion of said substrate, first and second electrodes uniformly disposed on a top surface and a bottom surface of said film, respectively, wherein said alternating peaks and valleys differ in height by a predetermined amount sufficient to cause vibration signals of said alternating peaks and valleys in response to a first signal incident thereon to be in opposite phase, thereby constructively adding to one another to generate an amplified output signal at a resonant frequency.

16. The transducer of claim 15, wherein said predetermined amount is an odd integer number of half wavelengths.

17. The transducer of claim 15 wherein said film is cylindrically-shaped and having a diameter D, and wherein the resonant frequency of the output signal is independent of the diameter of the cylinder.

18. A transducer comprising:

a piezoelectric film comprising a plurality of alternating concave and convex regions;

first and second electrodes disposed respectively on a top surface and a bottom surface of said piezoelectric film;

a substrate disposed beneath said piezoelectric film, said substrate having a plurality of projections in alignment with at least some of said concave regions for supporting said film;

wherein said piezoelectric film responsive to a first signal incident thereon to cause each of said concave and convex regions to vibrate with opposite phase to cause said transducer to operate at a given frequency.

19. A piezoelectric element comprising:

a single piezoelectric layer of a given length and width and deformable in response to a voltage applied thereto, said single piezoelectric layer shaped into a series of alternating convex and concave regions;

a first electrode uniformly disposed on a top surface of said piezoelectric layer, and a second electrode uniformly disposed on a bottom surface of said piezoelectric layer, said first electrode defining an exposed portion about a peripheral region of said piezoelectric layer;

first and second metal layers disposed opposite one another and coupled to the piezoelectric layer along the length of the peripheral region of said top surface for maintaining said concave and convex shape and for electrically coupling to a voltage source for applying said voltage across said first and second electrodes during operation to cause said concave and convex regions to vibrate to generate an output signal, wherein each said concave and convex region differs in height by approximately one half of the wavelength of the output signal to cause said concave and convex regions to vibrate with opposite phase, thereby constructively adding to one another to generate said output signal at a resonant frequency.

* * * * *